US006266238B1

(12) United States Patent
Paulsel et al.

(10) Patent No.: US 6,266,238 B1
(45) Date of Patent: Jul. 24, 2001

(54) ELECTROMAGNETIC EMISSION SHIELDING APPARATUS

(75) Inventors: Jason Q. Paulsel, Round Rock; Charles D. Hood, III, Cedar Park, both of TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/514,826

(22) Filed: Feb. 28, 2000

(51) Int. Cl.[7] ........................................ H05K 7/10

(52) U.S. Cl. .......................... 361/683; 361/725; 361/686; 312/332.1

(58) Field of Search .................................... 361/679, 680, 361/681, 682, 683, 684, 685, 686, 746, 724–727; 312/332.1, 333

(56) References Cited

U.S. PATENT DOCUMENTS 3,475,213 * 10/1969 Stow .................................... 117/227
5,663,867 * 9/1997 Honda et al. ........................ 361/684
5,832,080 * 11/1998 Beutler et al. ....................... 379/433
5,978,210 11/1999 McCrary .

* cited by examiner

*Primary Examiner*—Leo P. Picard
*Assistant Examiner*—Hung Van Duong
(74) *Attorney, Agent, or Firm*—Haynes and Boone, LLP

(57) ABSTRACT

A computer includes a first enclosure and a second enclosure pivotally attached to the first enclosure. The second enclosure is pivotable between a first position and a second position with respect to the first enclosure. An interconnect circuit has a first routing portion attached to the first enclosure, a second routing portion attached to the second enclosure and a spanning portion extending between the first and the second routing portions. A shielding member substantially surrounds the spanning portion of the interconnect circuit. A first conductive member has a curled portion attached to the shielding member and a tail portion electrically connected to a reference voltage member. The adverse affects associated with violating preferred design rules at the spanning portion of the interconnect circuit are reduced.

20 Claims, 5 Drawing Sheets

ELECTROMAGNETIC EMISSION SHIELDING APPARATUS

BACKGROUND

The disclosures herein relate generally to computer systems and more particularly to an electromagnetic emission shielding apparatus for a portable computer hinge assembly.

To generate an image on a display of a portable computer, electrical signals and power are routed between a top enclosure and a base enclosure of the computer. Currently, many portable computers use a display interconnect circuit, such as a flexible circuit, to electrically connect the base enclosure of the computer to the top enclosure. Display interconnect circuits typically include a dielectric substrate with multiple conductive traces mounted thereon for routing power, ground and signals from the base enclosure to the top enclosure. In addition to routing signals and power between the base enclosure and the top enclosure, display interconnect circuits must also accommodate the movement of the top enclosure relative to the base enclosure.

In general, display interconnect circuits include a display routing portion, a base routing portion and a spanning portion extending therebetween. The spanning portion electrically connects the display routing portion to the base routing portion. The spanning portion also accommodates the movement of the top enclosure of the computer relative to the base enclosure.

To reduce the potential for electromagnetic interference (EMI) with adjacent electronic devices, EMI shielding must be provided for portions of the circuit that are susceptible to electromagnetic emissions. Similar to the operating speed of microprocessors, the operating speed of video controllers continues to increase. High-speed video signals such as Low Voltage Differential Signaling (LVDS) signals are approaching signal speeds at which electromagnetic emission must be addressed. The magnitude of these speeds may result in electromagnetic emissions at the spanning portion of the display interconnect circuit.

The spanning portion of display interconnect circuits are particularly susceptible to electromagnetic emissions. The space and orientation that the spanning portion must accommodate within the computer often require that the circuit design rules for limiting electromagnetic emissions be violated. The spanning portion of a display interconnect circuit also extends adjacent to discontinuities defined by the hinge assembly that connects the top and base enclosures of a portable computer. The potential for electromagnetic emissions, particularly through the discontinuities, is increased when high speed video signals are carried by the spanning portion of the display interconnect circuit.

U.S. Pat. No. 5,978,210 discloses a display interconnect circuit including a spanning portion that is wrapped around a bobbin assembly. The bobbin assembly includes a core member and a removable cover member mounted on the core member. Shielding may be provided by a separate shielding member that shrouds the portion of the circuit that is wrapped around the core member of the bobbin assembly. The bobbin assembly and separate shielding member represent additional components that must be assembled on the production line during assembly of the computer, increasing manufactured cost of the computer.

Therefore, what is needed is a simple and cost-effective shielding apparatus for containment of electromagnetic emissions from the spanning portion of an interconnect circuit at the hinge assembly of an electronic device.

SUMMARY

Accordingly, in one embodiment, a shielding apparatus includes a shielding member that substantially surrounds the spanning portion of an interconnect circuit and provides a low-impedance current path between a plurality of routing portions of the interconnect circuit. To this end, one embodiment of an apparatus for shielding electromagnetic emissions includes a first conductive member having a deflectable portion. The deflectable portion is movable between a first position and a second position. A shielding member is electrically connected to the deflectable portion of the first conductive member.

A principal advantage of this embodiment is that the adverse effects associated with violating preferred design rules at the spanning portion of the interconnect circuit are reduced.

BRIEF DESCRIPTION OF THE DRAWING FIGURES

DETAILED DESCRIPTION

Figure 1:
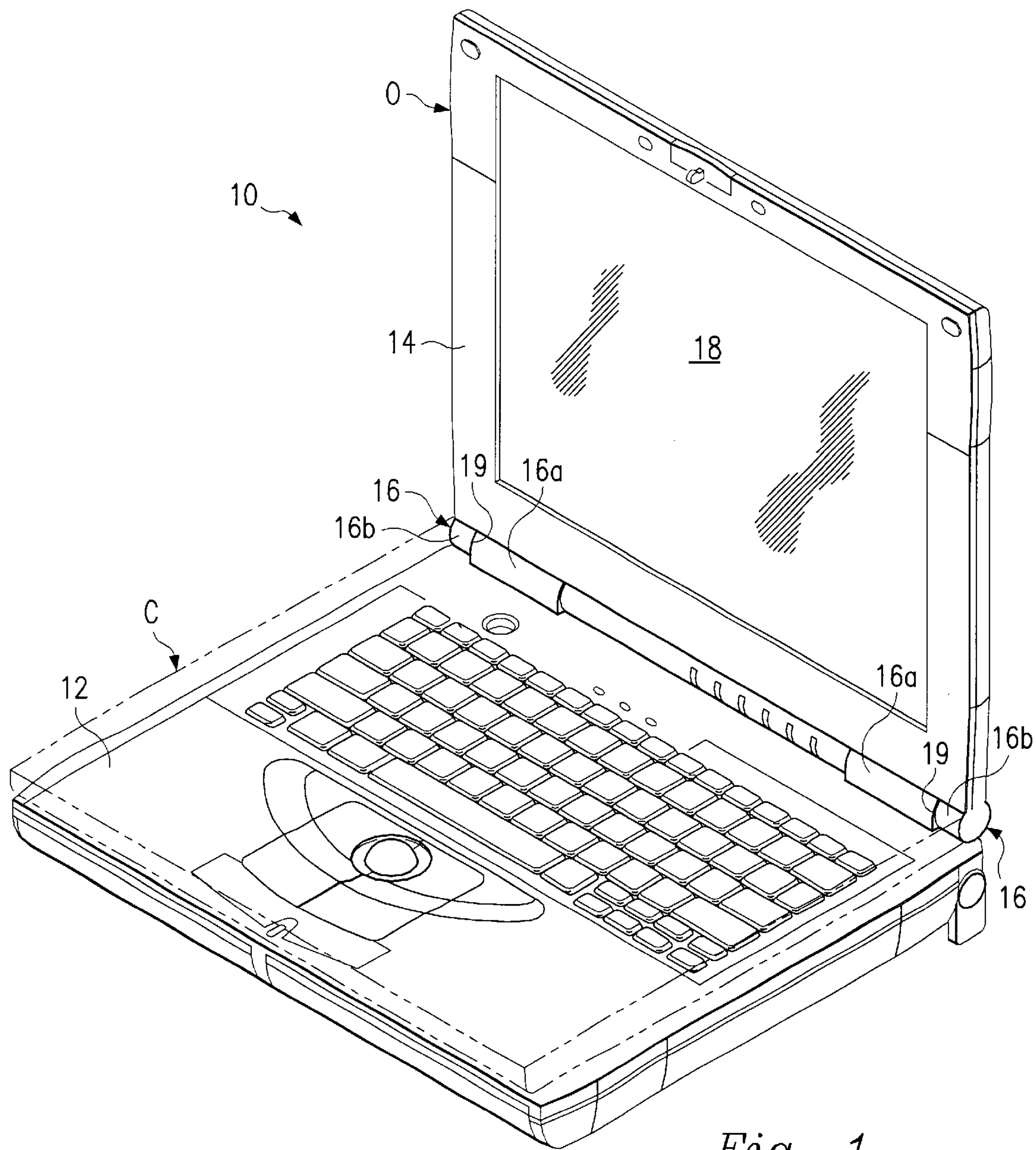
FIG. 1 is a perspective view illustrating an embodiment of a portable computer.

A portable computer, indicated generally at 10 in FIG. 1, typically includes a base enclosure 12 and a top enclosure 14. The top enclosure 14 is pivotally connected to the base enclosure 12 by a plurality of hinge assemblies 16. The hinge assemblies 16 permit the top enclosure 14 to be moved between an open position O and a closed position C. Each one of the hinge assemblies 16 includes a first hinge portion 16*a* attached to the base enclosure 12 and a second hinge portion 16*b* attached to the top enclosure 14. A liquid crystal display (LCD) panel 18 is mounted in the top enclosure 14. A discontinuity 19, such as a gap, is typically present between the first assembly 16*a* and the second hinge assembly 16*b*.

Figure 2A:
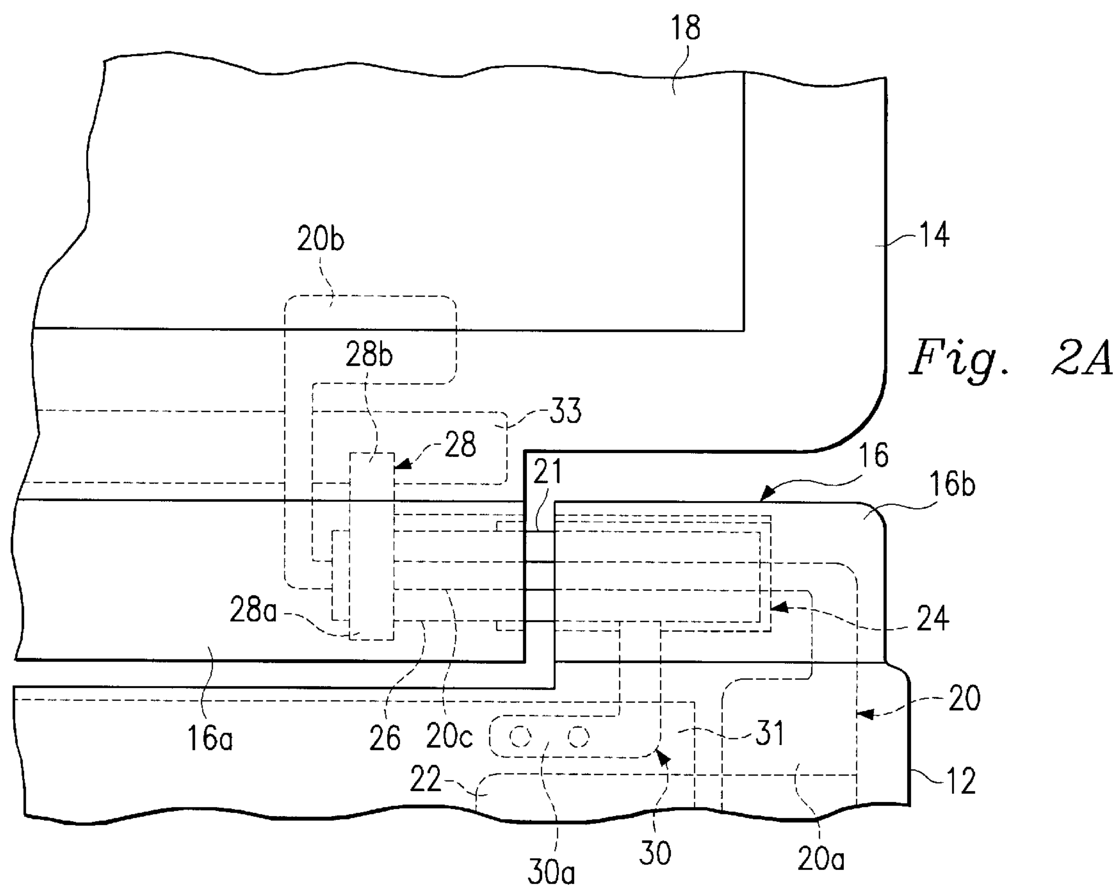
FIG. 2A is a fragmented front view showing an embodiment of an electromagnetic emission shielding apparatus mounted in a portable computer.

As illustrated in FIG. 2A, a display interconnect circuit 20 includes a first routing portion 20*a* mounted in the base enclosure 12, a second routing portion 20*b* mounted in the top enclosure 14 and a spanning portion 20*c* that extends between the first routing portion 20*a* and the second routing portion 20*b*. The spanning portion 20*c* provides for electrical continuity between the first routing portion 20*a* and the second routing portion 20*b*. The first routing portion 20*a* is typically electrically connected to a printed circuit substrate 22, such as the motherboard. The second routing portion 20*b* is typically electrically connected to the LCD panel 18. The spanning portion 20*c* is routed through one of the hinge assemblies 16.

As illustrated in FIGS. 2–6, a shielding apparatus 24 includes a shielding member 26, a first conductive member

Figure 2B:
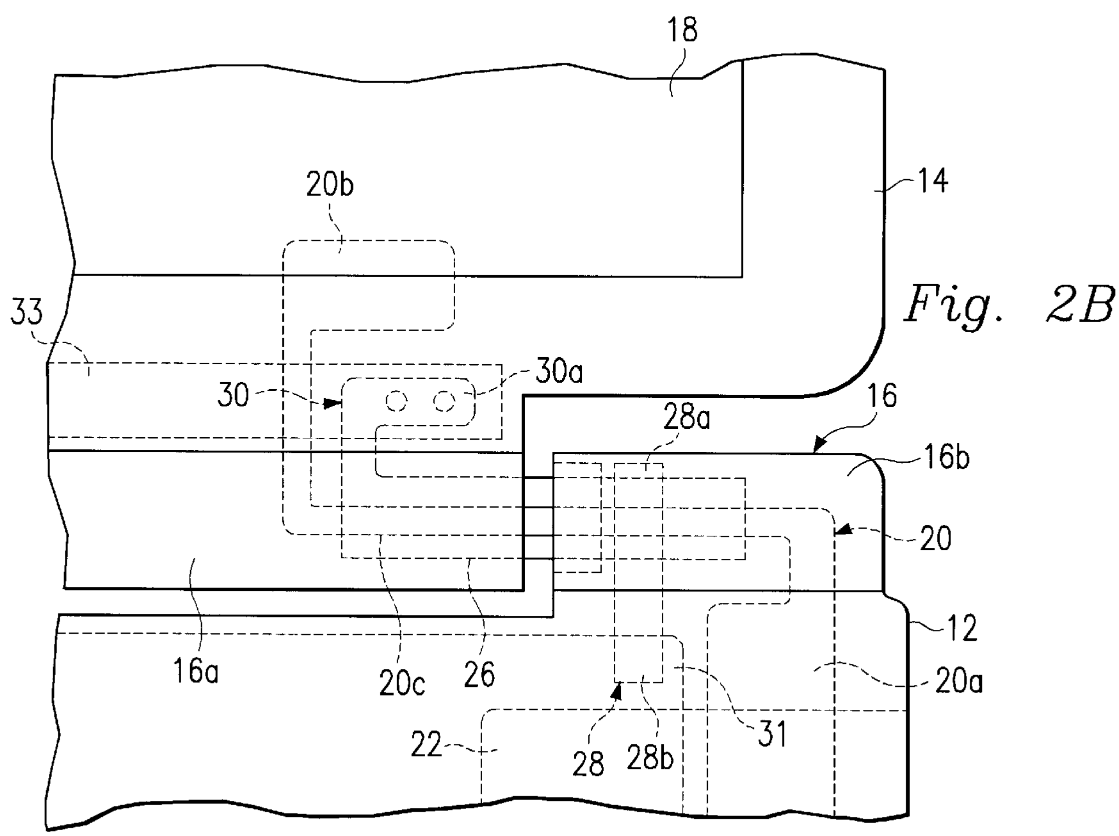
FIG. 2B is a fragmented front view showing another embodiment of an electromagnetic emission shielding apparatus mounted in a portable computer.
Figure 3:
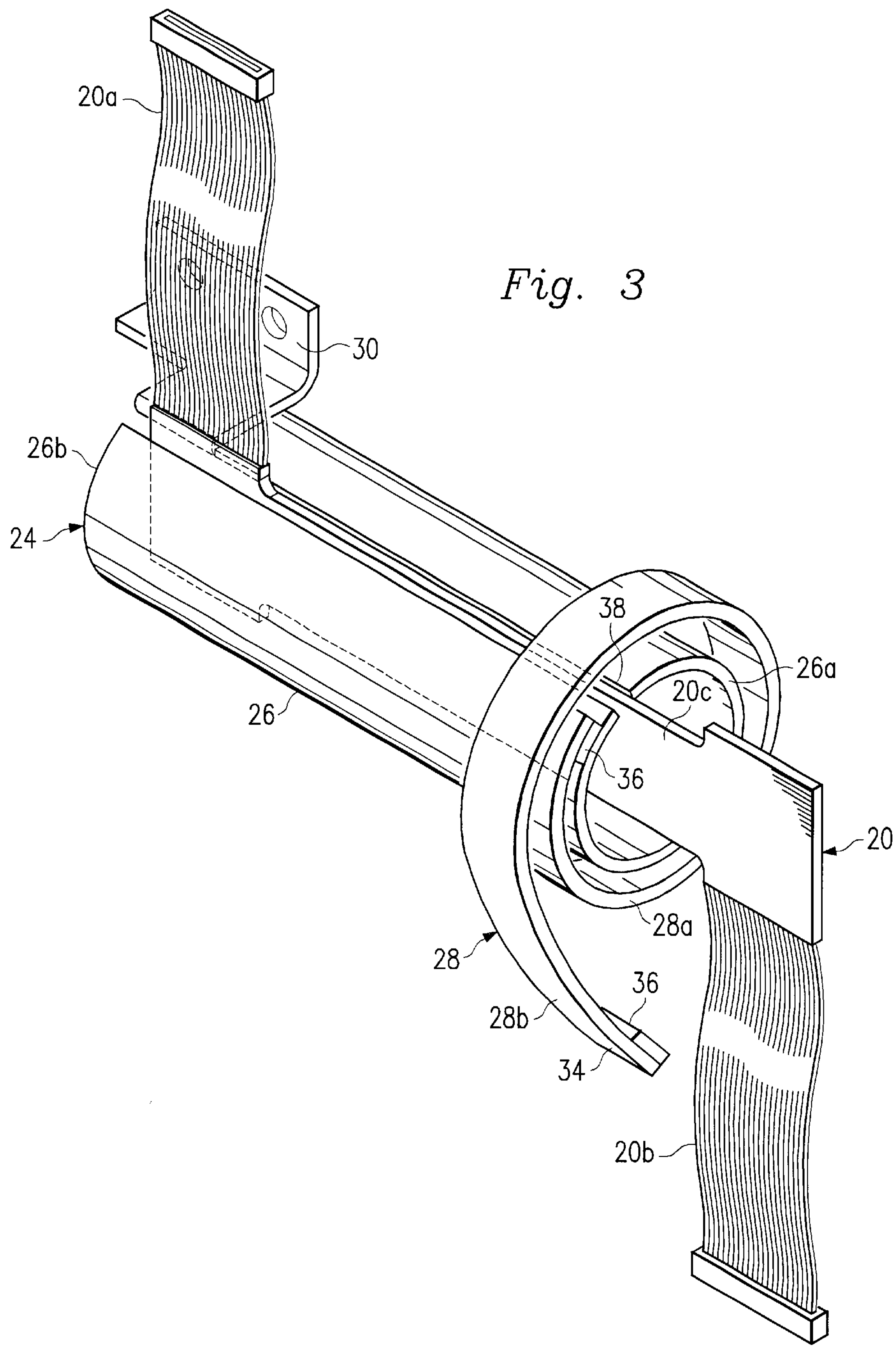
FIG. 3 is a perspective view illustrating an embodiment of a shielding apparatus installed on a spanning portion of a display interconnect circuit.
Figure 4:
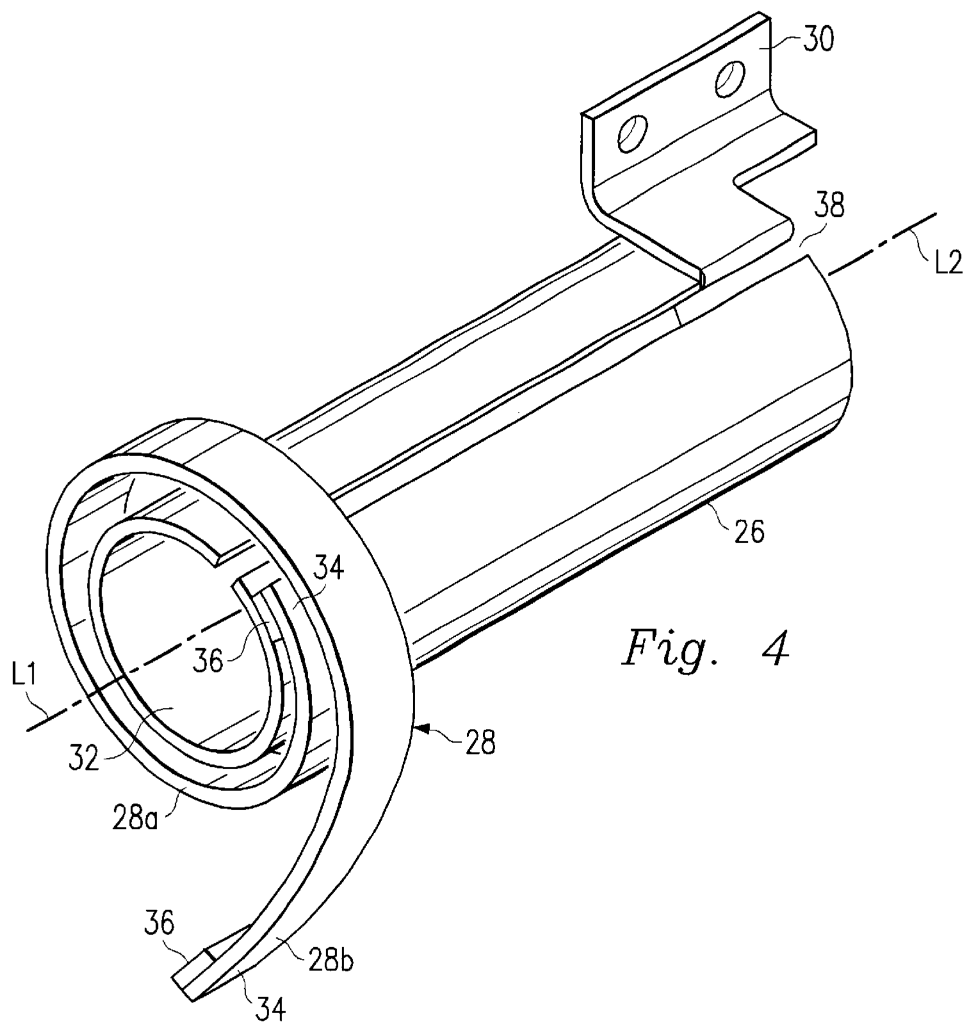
FIG. 4 is a perspective view of the shielding apparatus illustrated in FIG. 3.

28 and a second conductive member 30, FIGS. 2–4. The shielding apparatus 24 is jointly housed within one of the hinge assemblies 16, FIGS. 2A and 2B. The first conductive member 28 includes a curled portion 28*a*, broadly referred to as a deflectable portion, and a tail portion 28*b*. A first end 26*a* of the shielding member 26 is positioned within an interior region 32, FIG. 5, defined by the curled portion 28*a*. The spanning portion 20*c* of the display interconnect circuit 20 is substantially encompassed by the shielding member 26 of the electromagnetic emission shielding apparatus 24, FIG. 3.

In the embodiment illustrated in FIG. 2A, the curled portion 28*a* of the first conductive member is physically and electrically connected to the shielding member 26. The shielding member 26 is fixedly attached to the first enclosure 12 by a mounting bracket portion 30*a*. The mounting bracket portion 30*a* is fixedly connected between the shielding member 26 and a first grounded support member 31 that is mounted in the first enclosure 12. The tail portion 28*b* is connected to a second grounded reference member 33 that is mounted in the second enclosure 14.

In the embodiment illustrated in FIG. 2B, the curled portion 28*a* of the first conductive member is physically and electrically connected to the shielding member 26. The shielding member 26 is fixedly attached to the second enclosure 14 by a mounting bracket portion 30*a*. The mounting bracket portion 30*a* is fixedly connected between the shielding member 26 and the second grounded support member 33. The tail portion 28*b* is connected to the first grounded support member 31.

Figure 5:
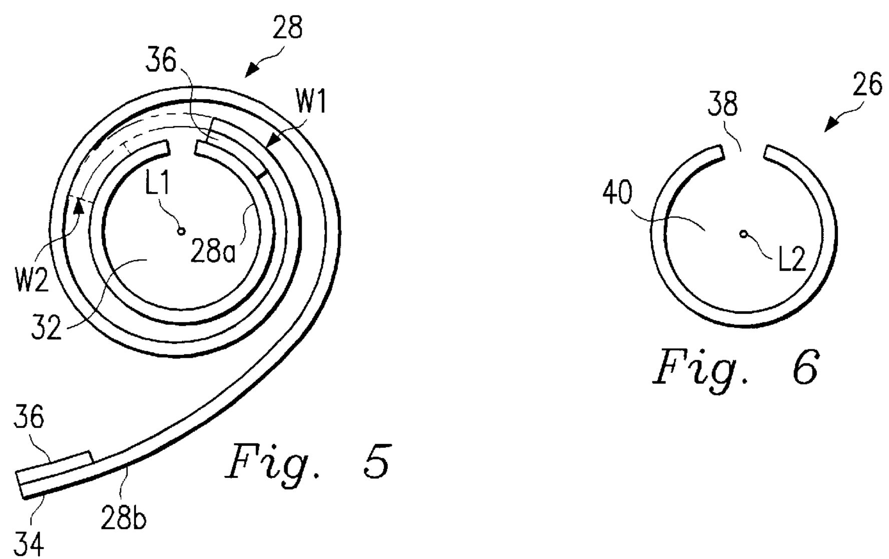
FIG. 5 is an end view of an embodiment of a conductive member having a curled portion.
Figure 6:
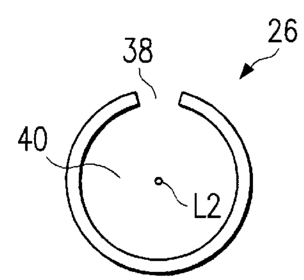
FIG. 6 is an end view of an embodiment of a shielding member.

The curled portion 28*a* of the first conductive member 28 moves between a first wound position W1 and a second wound position W2, FIG. 5, when the top enclosure 14 is moved between the open position O and the closed position C, FIG. 1. A first reference axis L1, FIG. 5, defined by the curled portion 28*a* of the first conductive member 28, extends generally parallel to a second reference axis L2, FIG. 6, defined by the shielding member 26.

The shielding member 26 is preferably fabricated from a cylindrical-shaped sleeve made from a conductive material such as copper, steel or aluminum. A slot 38, FIG. 3, extends between the first end 26*a* and a second end 26*b* of the shielding member 26. The spanning portion 20*c* of the display interconnect circuit 20 is inserted through the slot 38 into an interior region 40, FIG. 6, of the shielding member 26.

As commonly practiced, the first and the second grounded support members 31, 33, FIGS. 2A and 2B, as well as other grounded support members, are electrically connected to each other. The first conductive member 28 is a conductive tape including a conductive metallic layer 34, such as copper foil, with a full or partial layer of conductive adhesive 36, FIGS. 3–5. A reference voltage layer or trace (not shown) of the display interconnect circuit 20 may be used to provide an electrical connection between support members mounted in different enclosures.

Attachment of the curled portion 28*a* of the first conductive member 28 to the shielding member 26 permits the shielding member 26 to rotate in unison with the attached enclosure without exerting undue forces on the first conductive member 28. The shielding assembly 24 provides a low impedance current path between the first routing portion 20*a* and second routing portion 20*b* of the interconnect member 20. The shielding member 26 substantially encompasses the spanning portion 20*c* of the interconnect member 20. Accordingly, electrostatic emissions from the spanning portion 20*c* of the interconnect circuit 20 are shielded by the shielding member 26. The electrical currents induced by the electrostatic emissions are redirected to a reference voltage member, thereby reducing the potential for electromagnetic interference with adjacent electronic devices.

Figure 7:
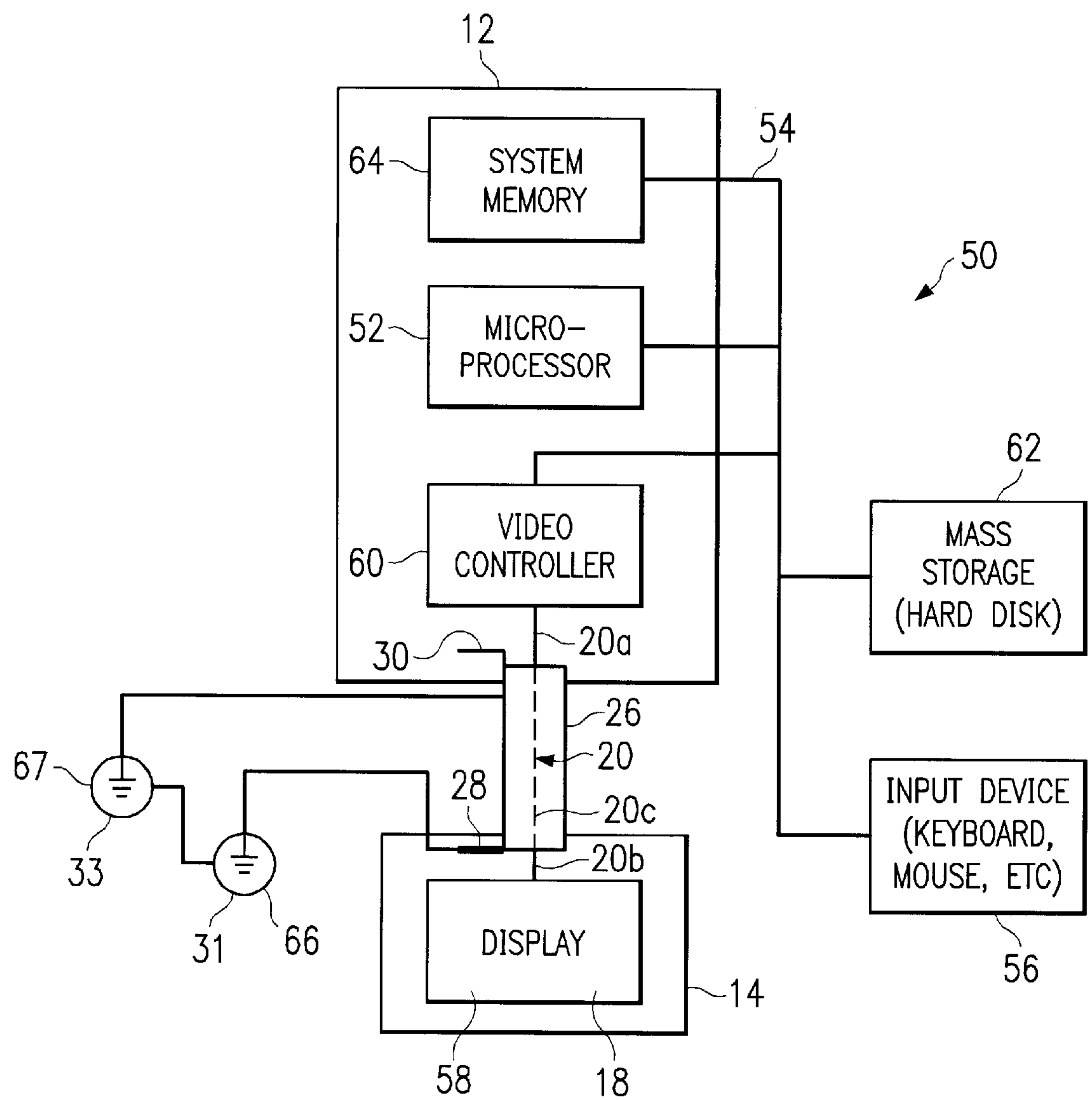
FIG. 7 is a block diagram view illustrating an embodiment of a computer system.

An embodiment of a computer system 50 is illustrated in FIG. 7. The computer system 50 includes at least one microprocessor 52. The microprocessor 52 is connected to a bus 54. The bus 54 serves as a connection between the microprocessor 52 and other components of the computer system 50. An input device 56 is coupled to the microprocessor 52 to provide input to the microprocessor 52. Examples of input devices include keyboards, touchscreens, and pointing devices such as a mouse, a trackball and a trackpad. The computer system 50 may also include a display 58, such as the LCD panel 18 discussed above, which is coupled to the microprocessor 52 typically by a video controller 60. Programs and data are stored on a mass storage device 62 which is coupled to the microprocessor 52. Mass storage devices include components such as hard disks, optical disks, magneto-optical drives, floppy drives, and the like. A system memory 64 provides the microprocessor 52 with fast storage to facilitate execution of computer programs by the microprocessor 52. It should be understood that other busses and intermediate circuits can be employed between the components described above and microprocessor 52 to facilitate interconnection between the components and the microprocessor 52.

Still referring to FIG. 7, with regard to the portable computer 10 discussed above, the microprocessor 52, video controller 60 and system memory 64 are mounted in a first enclosure such as the base enclosure 12. The display 58 is mounted in a second enclosure such as the top enclosure 14. The display routing circuit 20 is electrically connected between the video controller 60 and the display 58. The first routing portion 20*a* is connected to the video controller 60 and the second routing portion 20*b* is electrically connected to the display 58. The first conductive member 28 is electrically connected to a first reference voltage member 66, such as the first grounded support member 31. The second conductive member 30 is electrically connected to a second reference voltage member 67, such as the second grounded support member 33. As discussed above, it is common for the grounded support members 31, 33 to be electrically connected to each other.

As a result, one embodiment of an apparatus for shielding electromagnetic emissions includes a first conductive member having a deflectable portion. The deflectable portion is movable between a first position and a second position. A shielding member is electrically connected to the deflectable portion of the first conductive member.

Another embodiment provides a computer including a first enclosure and a second enclosure pivotally attached to the first enclosure. The second enclosure is pivotable between a first position and a second position with respect to the first enclosure. An interconnect circuit has a first routing portion attached to the first enclosure, a second routing portion attached to the second enclosure and a spanning portion extending between the first and the second routing portions. A shielding member substantially surrounds the spanning portion of the interconnect circuit. A first conductive member has a curled portion attached to the shielding member and a tail portion electrically connected to a reference voltage member.

A further embodiment provides a computer system including a first enclosure and a second enclosure pivotally attached to the first enclosure. The second enclosure is pivotable between a first position and a second position with respect to the first enclosure. A microprocessor is mounted in the first enclosure. A system memory is coupled to provide storage to facilitate execution of computer programs by the microprocessor. An input is coupled to provide input to the microprocessor. A display mounted in the second enclosure is coupled to the microprocessor by a video controller. A mass storage is coupled to the microprocessor. An interconnect circuit has a first routing portion attached to the first enclosure, a second routing portion attached to the second enclosure and a spanning portion extending between the first and the second routing portions. A shielding member substantially surrounds the spanning portion of the interconnect circuit. A first conductive member has a curled portion attached to the shielding member and a tail portion electrically connected to a reference voltage member.

In yet another embodiment, a method for shielding electromagnetic emissions includes providing a first conductive member including a curled portion defining an interior region. A spanning portion of an interconnect circuit is positioned within a central portion of a tubular shielding member. The shielding member is positioned within the interior region of the first conductive member. The curled portion of the first conductive member is then electrically connected to the shielding member.

As it can be seen, the embodiments presented herein provide several advantages. The adverse effects associated with violating preferred design rules at the spanning portion of the interconnect circuit are reduced. A single shielding apparatus construction covers a multitude of electronic device designs. The shielding apparatus provides a low-cost and simple solution. The shielding apparatus provides an additional degree of physical protection for the spanning portion. The shielding apparatus can be quickly and cost-effectively modified for new electronic device designs.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An apparatus for shielding electromagnetic emissions, comprising:

a shielding member including a first end, a second end and an elongated slot extending between the first end and the second end;

a first conductive member attached to the first end, the first conductive member including a deflectable portion, the deflectable portion being movable between a first position and a second position;

a second conductive member attached to the second end; and an interconnect circuit member mounted in the shielding member and insertable into the shielding member through the slot, the interconnect member having a first portion and a second portion attached thereto at opposite ends thereof.

2. The apparatus of claim 1 wherein the deflectable portion includes a curled portion and wherein the first position is a wound position and the second position is an unwound position.

3. The apparatus of claim 1 wherein the first conductive member is attached adjacent to the first end of the shielding member and wherein the second conductive member is attached adjacent to the second end of the shielding member.

4. The apparatus of claim 1 wherein the second conductive member includes an electrically conductive mounting member attached thereto.

5. The apparatus of claim 1 wherein the first conductive member is a conductive tape including a conductive backing layer and a conductive adhesive layer.

6. The apparatus of claim 2 wherein the curled portion defines an interior region thereof and wherein an end portion of the shielding member is positioned in the interior region.

7. The apparatus of claim 2 wherein the shielding member defines a first reference axis and the curled portion defines a second reference axis, the first and the second reference axes being substantially parallel.

8. A computer, comprising:

a first enclosure;

a second enclosure pivotally attached to the first enclosure, the second enclosure being pivotable between a first position and a second position with respect to the first enclosure;

an interconnect circuit including a first routing portion attached to the first enclosure, a second routing portion attached to the second enclosure and a spanning portion extending between the first and the second routing portions;

a shielding member substantially surrounding the spanning portion of the interconnect circuit, the shielding member including opposite ends and an elongated slot extending between the opposite ends, the spanning portion being insertable into the shielding member through the slot;

a first conductive member including a curled portion attached to the shielding member and a tail portion electrically connected to a reference voltage member, the first conductive member being attached to one of the ends; and a second conductive member attached to the other end.

9. The computer of claim 8 wherein the shielding member is fixedly attached to the second enclosure such that the curled portion of the first conductive member moves between a first curled position and a second curled position when the second enclosure is moved between the first position and the second position.

10. The computer of claim 8 further comprising:

a display mounted in the first enclosure.

11. The computer of claim 8 further comprising:

a display mounted in the second enclosure.

12. The computer of claim 8 further comprising:

a second conductive member attached to the shielding member.

13. The computer of claim 8 wherein the first routing portion is attached adjacent to a first end of the shielding member and wherein the second routing portion is attached adjacent to a second end of the shielding member, the second end of the shielding member being fixedly attached to the second enclosure such that the curled portion of the first conductive member moves between a first curled position and a second curled position when the second enclosure is moved between the first position and the second position.

14. The computer of claim 11 wherein the second conductive member includes a mounting bracket fixedly attached to the shielding member and to the second enclosure.

15. The computer of claim 11 wherein the second conductive member is electrically connected to the reference voltage member.

16. A computer system, comprising:

a first enclosure;

a second enclosure pivotally attached to the first enclosure, the second enclosure being pivotable between a first position and a second position with respect to the first enclosure;

a microprocessor mounted in the first enclosure;

a system memory coupled to provide storage to facilitate execution of computer programs by the microprocessor;

an input coupled to provide input to the microprocessor;

a video controller coupled to the microprocessor;

a mass storage coupled to the microprocessor;

an interconnect circuit including a first routing portion attached to the first enclosure, a second routing portion attached to the second enclosure and a spanning portion extending between the first and the second routing portions;

a shielding member substantially surrounding the spanning portion of the interconnect circuit, the shielding member including opposite ends and an elongated slot extending between the opposite ends, the spanning portion being insertable into the shielding member through the slot;

a first conductive member including a curled portion attached to the shielding member and a tail portion electrically connected to a reference voltage member, the first conductive member being attached to one of the ends; and a second conductive member attached to the other end.

17. A method for shielding electromagnetic emissions, comprising the steps of:

providing a first conductive member including a curled portion defining an interior region thereof;

positioning a spanning portion of an interconnect circuit within a central portion of a tubular shielding member;

positioning the shielding member within the interior region of the first conductive member;

electrically connecting the curled portion of the first conductive member to the shielding member;

forming a slot in the shielding member, the slot extending between the first and second ends of the shielding member; and inserting the spanning portion of the interconnect circuit through the slot.

18. The method of claim 17 further comprising the step of:

attaching a second conductive member to the shielding member.

19. The method of claim 18 further comprising the steps of:

electrically connecting the first conductive member to a first routing portion of the interconnect circuit, and electrically connecting the second conductive member to a second routing portion of the interconnect circuit.

20. The method of claim 19 further comprising the steps of:

pivotally attaching a first enclosure to a second enclosure;

attaching the first routing portion of the interconnect member to the first enclosure;

attaching the second routing portion of the interconnect member to the second enclosure; and connecting the shielding member to the second enclosure such that the shielding member pivots with respect to the first enclosure when the second enclosure is moved between the first position and the second position, and such that the curled portion of the first conductive member moves between a first curled position and a second curled position.

* * * * *